United States Patent [19]

Bell et al.

[11] 4,328,578
[45] May 4, 1982

[54] DIGITAL RECEIVER/TRANSCEIVER SYNCHRONIZATION PULSE DETECTOR FOR A MULTIPLEXING SYSTEM

[75] Inventors: Robert R. Bell, Libertyville, N.Y.; Scott T. Christians, Seguin, Tex.

[73] Assignee: Motorola Inc., Schaumburg, Ill.

[21] Appl. No.: 108,425

[22] Filed: Dec. 31, 1979

[51] Int. Cl.³ .............................................. H04J 3/06
[52] U.S. Cl. ...................................... 370/100; 370/9; 375/106; 455/151
[58] Field of Search ...................... 455/73, 76, 77, 78, 455/88, 151–152, 154, 158, 160, 165, 166, 183, 185, 186, 352–355, 142, 145, 146–147; 370/9, 100; 375/106

[56] References Cited

U.S. PATENT DOCUMENTS

| | | | |
|---|---|---|---|
| 3,651,454 | 3/1972 | Venema | 370/9 |
| 3,827,026 | 7/1974 | Viswanathan | 370/9 |
| 3,985,969 | 10/1976 | Eisenberg | 370/112 |
| 4,156,253 | 5/1979 | Steudel | 358/145 |
| 4,197,498 | 4/1980 | Fukui | 455/77 |

Primary Examiner—David L. Stewart
Attorney, Agent, or Firm—Phillip H. Melamed; James W. Gillman

[57] ABSTRACT

A radio transceiver is disclosed having manual controls on a microphone and the remainder of the circuitry located in a main chassis. The microphone and chassis are connected by means of a multiconductor cable, and time sharing multiplexing techniques are utilized and serially transmit information, bidirectionally, along a common data line while a clock line is utilized to synchronize the operation of main chassis and microphone circuitry. Multiple bit binary coded digital words are sent to the microphone to activate microphone displays while analog signals are sent from the microphone to the main chassis to provide analog control signals for the transceiver.

A digital synchronizing pulse detector is disclosed for use in the above transceiver multiplexing system. The detector identifies synchronizing pulses which occur in the clock signal wherein the identification insures the synchronization of microphone and main chassis circuitry.

The transceiver provides for designating a subset of all of the available communication channels as desired channels, and in a memory mode the transceiver is tuned only to those desired channels. Distinctive visual displays are produced indicating if any channels have been designated as desired channels, and if all possible storage space for storing desired channel identification has been utilized. In addition, the dual use of a few pushbuttons is disclosed such that the sequence in which these pushbuttons are actuated determines the transceiver mode of operation selected.

5 Claims, 8 Drawing Figures

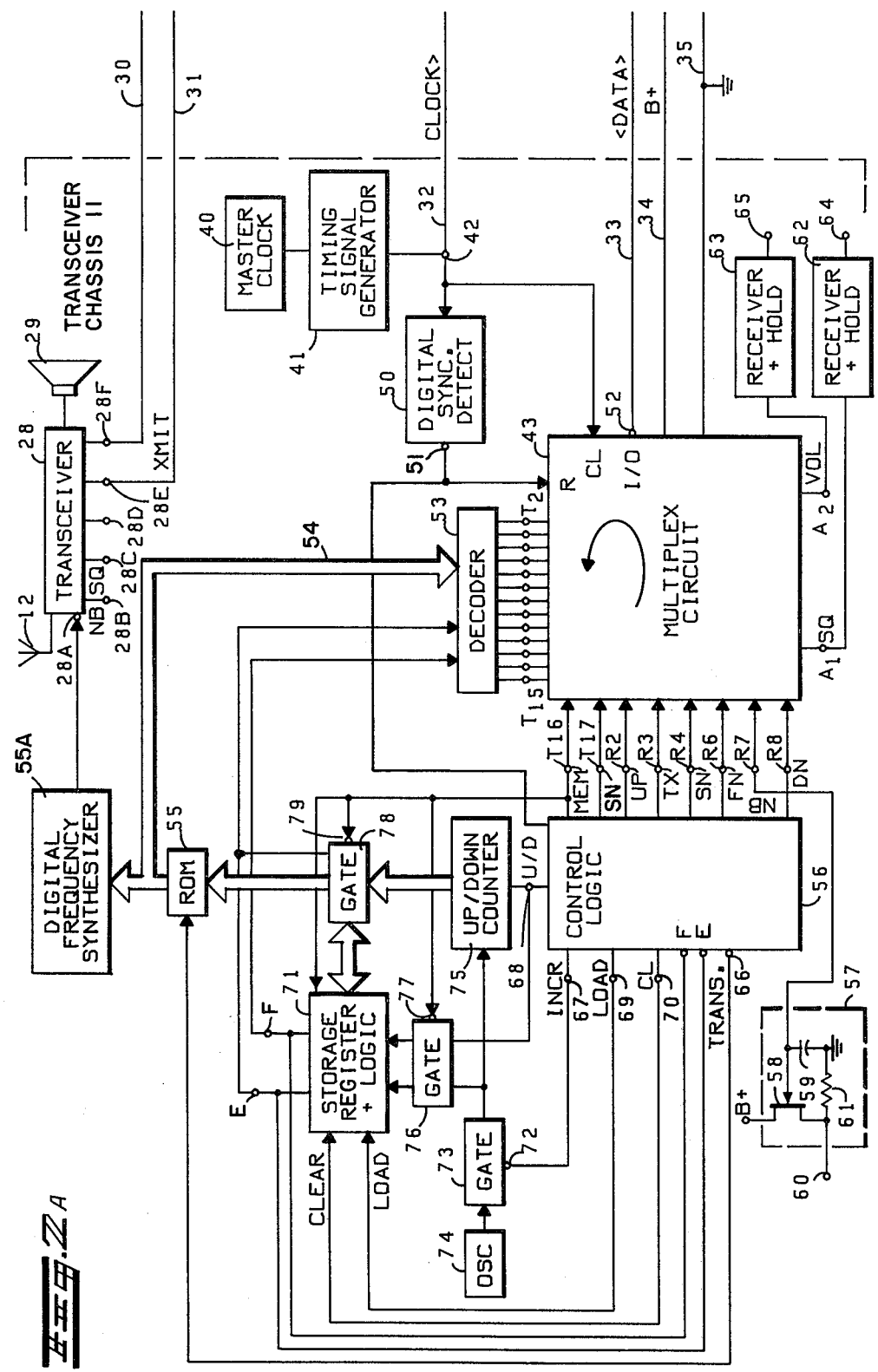

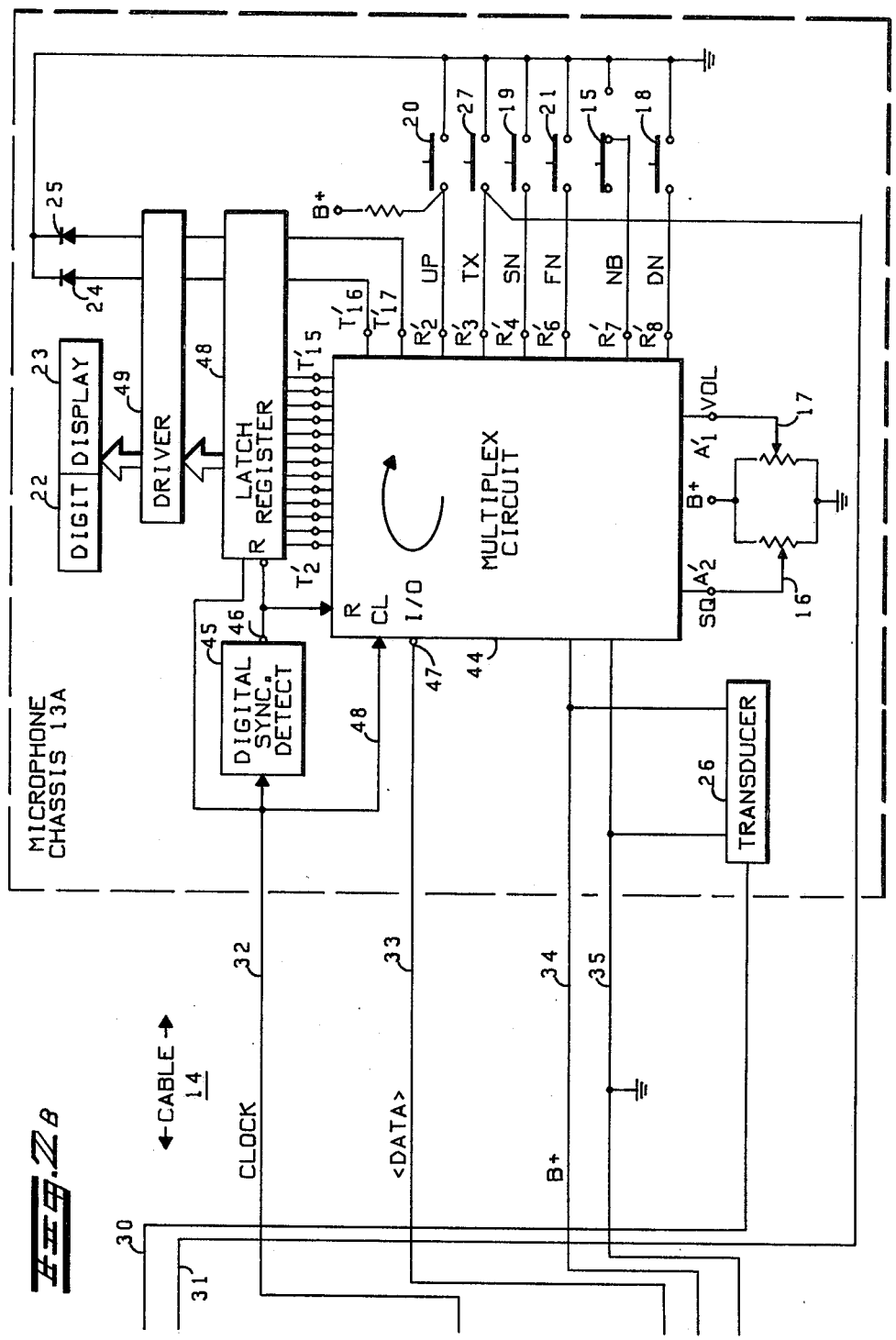

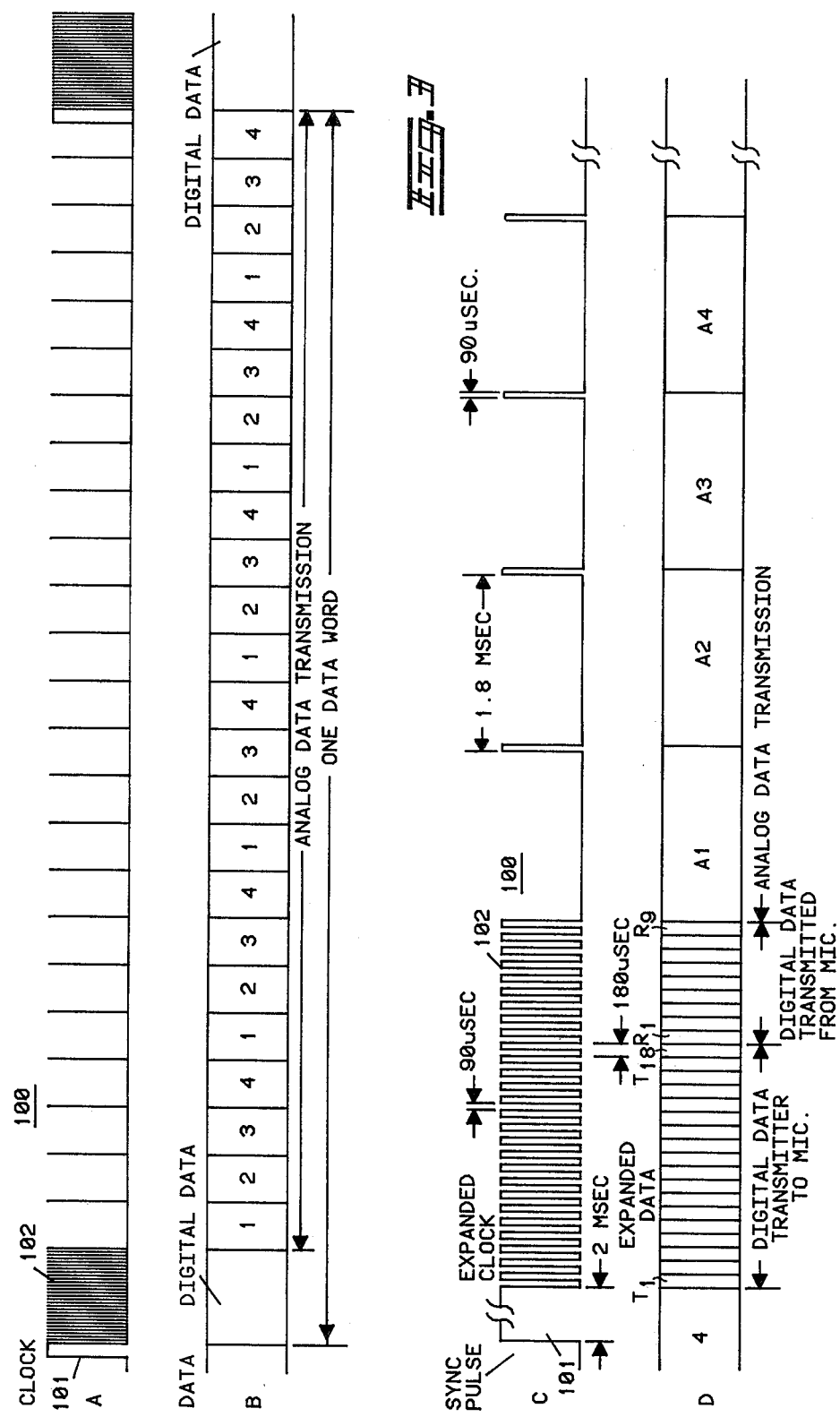

FIG. 3E

TABLE OF ORDER OF DATA TRANSMISSION

| | |
|---|---|
| T1 | SPARE CHANNEL |
| T2 | G SEGMENT OF TENS DISPLAY |
| T3 | B SEGMENT OF TENS DISPLAY |
| T4 | G SEGMENT OF UNITS DISPLAY |
| T5 | F SEGMENT OF UNITS DISPLAY |
| T6 | A SEGMENT OF TENS DISPLAY |
| T7 | E SEGMENT OF TENS DISPLAY |
| T8 | A AND D SEGMENTS OF TENS DISPLAY |
| T9 | SPARE CHANNEL |
| T10 | D SEGMENT OF UNITS DISPLAY |
| T11 | B SEGMENT OF UNITS DISPLAY |
| T12 | C SEGMENT OF TENS DISPLAY |
| T13 | C SEGMENT OF UNITS DISPLAY |
| T14 | F SEGMENTS OF TENS DISPLAY |
| T15 | E SEGMENT OF UNITS DISPLAY |
| T16 | MEMORY LED |
| T17 | SCAN LED |
| T18 | SPARE CHANNEL |
| R1 | SPARE CHANNEL |
| R2 | "UP" COMMAND |
| R3 | "P.T.T.(Tx)" COMMAND |
| R4 | "SCAN" COMMAND |
| R5 | SPARE CHANNEL |
| R6 | "FN" COMMAND |
| R7 | NOISE BLANKER ENABLE |
| R8 | "DN" COMMAND |
| R9 | SPARE CHANNEL |
| A1 | VOLUME CONTROL |
| A2 | SQUELCH CONTROL |
| A3 | SPARE ANALOG CHANNEL |
| A4 | SPARE ANALOG CHANNEL |

THIS SEQUENCE OF A1 THROUGH A4 IS CONTINUED UNTIL THE NEXT SYNC PULSE OCCURES.

| A | | |
|---|---|---|
| F | G | B |
| E | | C |
| | D | |

SEGMENT FORMAT FOR DIGITAL DISPLAY

TYPICAL SIGNAL DURATIONS

TOTAL SYNC. PULSE TIME (101)         2 MSEC.
TOTAL DIGITAL DATA TRANSMISSION TIME  4.86 MSEC.
TOTAL ANALOG DATA TRANSMISSION TIME  45.11 MSEC.
TOTAL DATA WORD TIME                 49.97 MSEC.

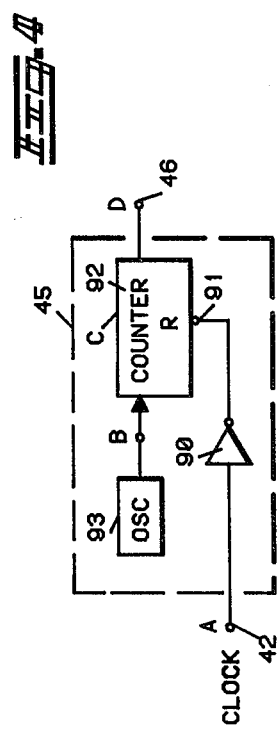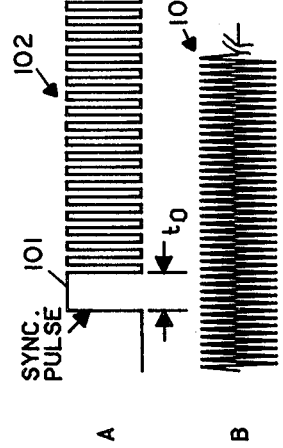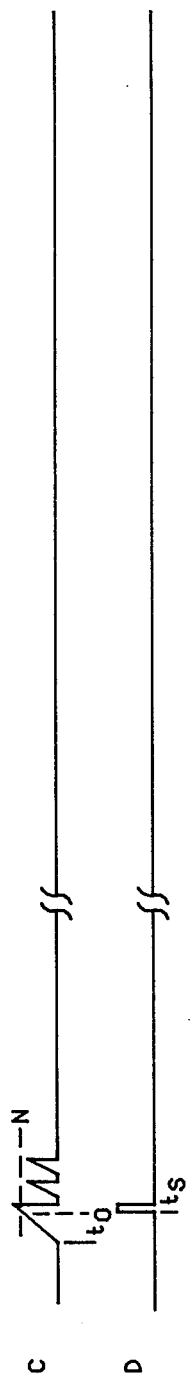

DIGITAL RECEIVER/TRANSCEIVER SYNCHRONIZATION PULSE DETECTOR FOR A MULTIPLEXING SYSTEM

CROSS REFERENCE TO RELATED APPLICATIONS

The present invention is related to the inventions disclosed in the following copending U.S. patent applications: "Visual Display of Contents of Transceiver/Receiver Programmable Scanning Channel Memory", Ser. No. 108,429, filed Dec. 31, 1979; "Transceiver/Receiver Information Multiplexing System", Ser. No. 108,433, filed Dec. 31, 1979; and "Multi-Channel Communication Device with Manual and Automatic Scanning Electronic Channel Selection", Ser. No. 005,544, filed Jan. 22, 1979.

BACKGROUND OF THE INVENTION

The present invention relates to the field of receivers (preferably transceivers) in which synchronizing pulses are used to coordinate the serial transmission and reception of information in a time shared multiplex system.

In prior multiplexing systems it is necessary to synchronize the transmission and reception of information along a common data line. This means that switching circuits must be utilized at both ends of the data line to insure that when one type of data is transmitted from one end of the data line it is received by the correct receiving circuitry at the other end of the data line. This is generally accomplished by supplying a timing clock signal along a conductor line separate from the common data line. Generally the timing clock signal includes a synchronization pulse for initializing switching circuitry at at least one end of the common data line. After the synchronization pulse additional signalling pulses then follow which are utilized to control the switching circuits at both ends of the data line. This technique is commonly used in time shared multiplexing systems.

To identify the existence of a synchronization pulse, various synchronizing pulse detectors have been utilized. Some systems depend upon the amplitude of the timing clock signal for controlling various timing functions, and therefore to determine the occurrence of a synchronization pulse these systems use an amplitude comparator as a detector to determine when the timing clock signal has a specified amplitude. An example of such a synchronizing pulse detector is illustrated in paper number 760181 presented at the Society of Automotive Engineers, Feb. 23-27, 1976, entitled "Time-Shared Multiplexing System Applied to Motor Vehicles". Other synchronizing pulse detectors identify the synchronizing pulse by attempting to calculate the duration of the synchronizing pulse wherein the synchronizing pulse duration is longer than other timing pulses, if other timing pulses exist. A common example of this other type of synchronizing pulse detector would be the vertical synchronizing pulse detector commonly used for television reception. In this type of detector the existence of the vertical synchronizing pulse is determined by performing an amplitude integration during the time that the synchronizing pulse occurs.

Both of the above discussed prior art synchronizing pulse detectors are subject to false detections of the synchronizing pulse since they are both sensitive to amplitude variations of the synchronizing pulse. Certainly the first prior system which is totally dependent upon the amplitude of the received timing clock signal is extremely susceptible to all variations in the amplitude of the timing clock signal. Similarly, the television synchronizing pulse detector is also sensitive to the amplitude of the received synchronization pulse since if the pulse amplitude momentarily disappears due to a noise pulse the integration ceases or proceeds in a reverse direction. This result is responsible for in the rolling of television pictures during extremely noisy conditions since proper identification of the vertical synchronizing pulse is not occuring.

In a transceiver where channel select information is multiplexed between a remote control unit and a main chassis, improper identification of a synchronization pulse could result in selection of and/or transmission on the wrong channel. This would result in lost reception or transmission of messages and therefore must be prevented at all cost.

SUMMARY OF THE INVENTION

An object of the invention is to provide an improved receiver/transceiver synchronization pulse detector for detecting a synchronization pulse which is relatively longer than other timing pulses in a received clock signal.

A more specific object of the present invention is to provide a receiver/transceiver synchronizing system in which the operation of local and remote transceiver switching circuits are synchronized by an improved synchronization pulse detector which detects synchronization pulses that are relatively longer than other timing pulses in a received clock signal.

A further object of the present invention is to provide a synchronization pulse detector for detecting relatively long transceiver synchronization pulses in a timing clock signal wherein the pulse detector is relatively insensitive to amplitude variations of the clock signal and which is usable in a time shared multiplexing system to synchronize the operation of local and remote transceiver switching circuits.

In one embodiment of the present invention a receiver/transceiver is provided with a digital receiver synchronization pulse detector for detecting periodic synchronization pulses, having long durations relative to other timing pulses, in a received clock signal. The receiver/transceiver synchronization pulse detector comprises: terminal means for receiving a clock signal having periodic synchronization pulses of a first duration followed by pulses of lesser duration; oscillator means for producing a fixed frequency signal having a first predetermined periodic rate insuring the occurrence of a substantial number of cycles of said fixed frequency signal during the first durations of said synchronization pulses; counter means for receiving said fixed frequency signal and developing a count related to the number cycles of said fixed frequency signal received, said counter means having a maximum capacity of N counts and including an overflow terminal means at which an indicative signal is produced when the N count capacity of the counter means is exceeded, said counter means also having a reset terminal for reinitializing the count of said counter means; said terminal means being coupled to said reset terminal wherein for said synchronization pulses of said first duration, the count in said counter means will exceed N counts resulting in indicating the detection of the occurrence of a synchronization pulse by providing an indicative signal at said overflow terminal means and wherein said lesser duration pulses result in resetting the count of said counter means before said counter means can attain a count of N counts.

Essentially the present invention provides for the use of the digital synchronization pulse detector means described above in a transceiver synchronization system in which the operation of local and remote transceiver switching circuits are synchronized by a received clock signal containing a synchronization pulse. More specifically, the present invention provides a time shared multiplexing system in which switching circuits in a transceiver microphone and a transceiver main chassis are synchronized through the use of the above described digital transceiver synchronization pulse detector coordinating the activities of the switching circuits so as to permit the series transmission of data over a common data line conductor connecting the microphone and main chassis. By the use of the improved digital synchronization pulse detector in the transceiver time shared multiplexing system, the operation of the entire system is enhanced since the system will be substantially less likely to be affected by noise interference which can affect the amplitude of the timing clock signal. Also, the construction of the digital transceiver synchronization pulse detector described above can be readily implemented by digital integrated circuit technology which is likely to be used for the switching control circuits for the transceiver time shared multiplexing system. Thus the transceiver synchronization pulse detector and the local and remote switching circuits described above can be readily implemented on a single integrated circuit by use of the present invention.

BRIEF DESCRIPTION OF THE DRAWINGS

For a more complete understanding of the present invention reference should be made to the drawings, in which:

FIGS. 2A and 2B, when combined, form a block diagram of the transceiver and remote microphone illustrated in FIG. 1;

FIG. 3 is a series of four graphs illustrating various signal waveforms for the circuit shown in FIG. 2, and also includes a table illustrating the order of data transmission between the remote microphone and the main transceiver chassis;

FIG. 4 is a preferred embodiment of one of the block components shown in FIG. 2;

FIG. 5 is a series of graphs illustrating the signal waveforms at various terminals of the circuit shown in FIG. 4.

DESCRIPTION OF THE PREFERRED EMBODIMENT

Figure 1:
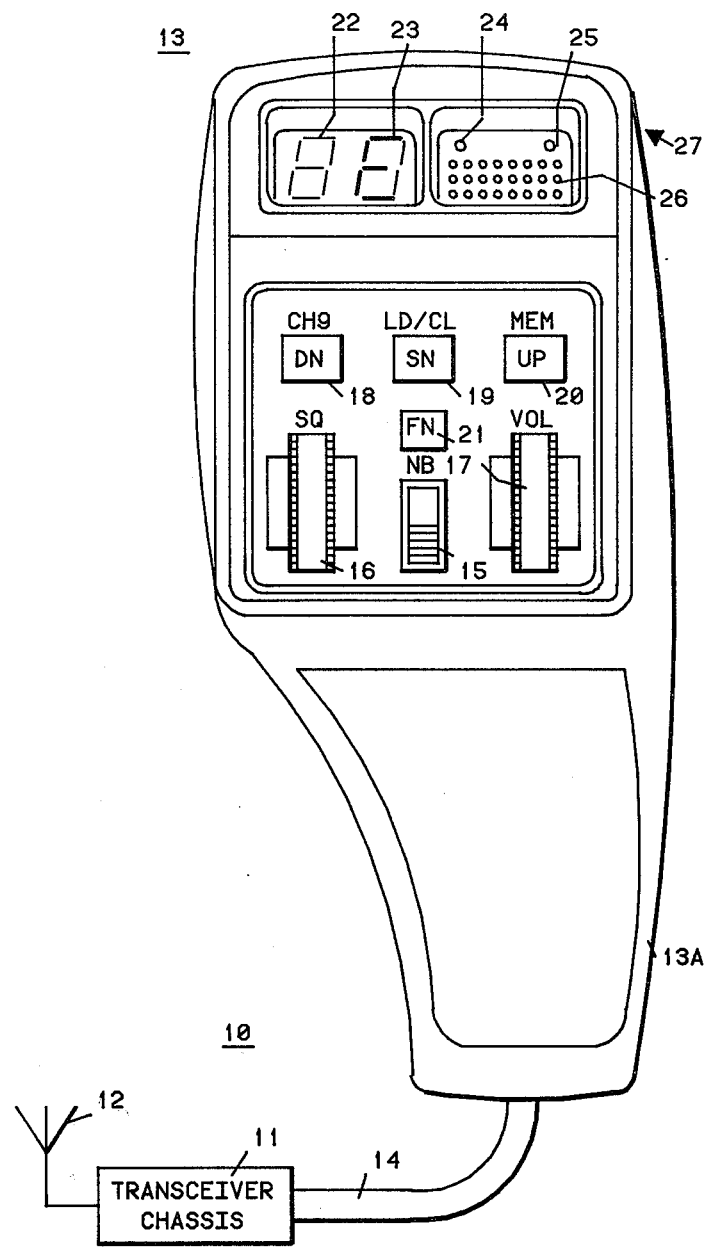
FIG. 1 is a combination schematic and plane view of a radio transceiver with remote control microphone which embodies the present invention.

FIG. 1 illustrates a citizens band (CB) radio transceiver 10 having a main transceiver chassis 11 (shown in block form), an antenna 12 (shown schematically) which is coupled to the chassis 11, a remote control microphone 13 (shown in a plane view) and a cable 14 (shown schematically) which couples control signals between the transceiver chassis and the remote control microphone 13 which is remotely located from the transceiver chassis and has its own separate microphone chassis 13A.

The remote control microphone 13 has a plurality of manually adjustable controls for controlling the operation of the transceiver 10. More specifically, the microphone 13 has a two position slide switch 15 which controls the actuation of a noise blanking circuit contained in the transceiver chassis 11. The microphone 13 also carries two continuously infinitely adjustable manually controllable thumbwheel controls 16 and 17 which control the operation of squelch and volume control circuits located in the transceiver chassis 11, respectively. Each of the thumbwheel controls 16 and 17 is contemplated as providing for the adjustment of the magnitude of separate analog control signals, in infinitely small increments, that are produced in the chassis of the microphone 13, and these analog control signals are serially transmitted via the cable 14 to the chassis 11 for control of squelch and volume circuits located therein. This transmission takes place according to a novel multiplexing system which will be discussed further subsequently.

Four pushbutton controls 18 through 21 are also located on the microphone 13. These are designated the down (DN) pushbutton 18, the scan (SN) pushbutton 19, the up pushbutton 20, and the function (FN) pushbutton 21. These pushbuttons essentially control channel selection for the transceiver 10. The microphone 13 also carries an illumniated visual display comprising two seven segment integral display modules 22 and 23 which are normally used to indicate, in digital numeric form, the communication channel to which the transceiver 10 is tuned. The display module 23 is also selectively utilized to produce an alphabetic display of either an "E" or "F", and the significance of this display will be discussed subsequently. The microphone 13 also carries two light emitting diodes (LED) 24 and 25 which are utilized to selectively indicate the existence of tuning memory and channel scanning modes of operation, respectively, of the transceiver 10. These modes of operation are implemented by the sequential actuation of the pushbuttons 18 through 21 in a manner to be subsequently described. The microphone 13 also carries a transducer 26 which is generally indicated as being located underneath a microphone grill which is part of the chassis of the microphone 13. In addition, on the back side of the microphone chassis, as opposed to the visible front side of the microphone chassis shown in FIG. 1 on which all the controls and displays 15 through 26 are mounted, a push-to-talk pushbutton switch 27 is located. The push-to-talk switch essentially is utilized by the operator of the transceiver to convert the transceiver from its receiving mode to its transmitting mode. Such push-to-talk switches are well known and will therefore not be further discussed.

FIGS. 2A and 2B, when placed together with FIG. 2B alongside of FIG. 2A, illustrate in block and schematic form the electronic components of the transceiver 10 illustrated in FIG. 1. FIG. 2B essentially illustrates the components in the microphone chassis 13A while FIG. 2A essentially illustrates the components in the transceiver chassis 11. In all FIGS. 1-6 identical reference numbers are utilized to identify corresponding identical components and/or signals. The cable 14 in FIGS. 2A and 2B is illustrated as comprising essentially six conductor wires 30 through 35 which couple the components in the microphone chassis 13A to components in the transceiver chassis 11. The conductor wires 34 and 35 are used to couple B+ and ground potentials, respectively, between the microphone 13 and transceiver chassis 11.

The wire 30 couples the output of the transducer 26 on the microphone to a block 28 labeled "transceiver" in FIG. 2A. This block 28 is contemplated as containing standard receiver and transmitter circuits including noise blanking, volume control and squelch control circuits along with switching circuitry to implement switching between receiving and transmitting modes of operation. The details of the transceiver block 28 are not illustrated since these components are well known and do not form an essential part of the present invention. The transceiver block 28 is coupled to the antenna 12 and is also coupled to a speaker 29. In addition, the transceiver block 28 receives control signal inputs at terminals 28A through 28F wherein these terminals receive the following control input signals, respectively: 28A, a tuning mixer input signal from a local oscillator having a desired frequency; 28B, a noise blanker control signal for determining if noise blanking circuitry internal to the transceiver block 28 is operative or not; 28C, a squelch setting control signal which determines the squelch level of corresponding squelch circuitry internal to the transceiver block 28; 28D, a volume control signal for setting the amplitude level of signals to be supplied from the transceiver 28 to the speaker 29; 28E, a transmit control signal to determine whether the transceiver 28 is operative as a receiver or transmitter; and 28F, an audio modulation input signal for use in modulating a carrier frequency when the transceiver is operative as a transmitter. It is contemplated that the squelch and volume control signals received at the terminals 28C and 28D are analog signals wherein the magnitude of these signals is adjustable in infinitely small increments and determines the operational levels of corresponding squelch and volume circuitry internal to transceiver block 28.

Essentially the transceiver 10 operates by periodically monitoring the manual controls present on the microphone chassis 13A and altering the operation of the circuitry contained in the transceiver chassis 11, as well as altering the visual displays on the microphone chassis 13A, in response thereto. This is accomplished by providing a clock timing signal 100 on the conductor wire 32 and for providing for the bidirectional exchange of data on the conductor 33 between the microphone chassis 13A and the transceiver chassis 11. In this manner the number of separate electrical conductors between the microphone chassis and transceiver chassis is minimized. This exchange of data is accomplished through the use of control circuitry in the transceiver chassis 11 which results in operating multiplex circuits contained in the transceiver chassis and the microphone chassis. This mode of operation will now be described in detail with reference to the circuitry illustrated in FIGS. 2A and 2B and the waveforms and table illustrated in FIG. 3.

Essentially, the transceiver chassis 11 has internal to it a high frequency master clock 40 which produces a fixed frequency, high frequency timing signal that is received by a timing signal generator 41 which consists of a number of counters and dividers that utilize the signal from clock 40 to generate a fixed period clock signal 100 at an output terminal 42 that is directly connected to the conductor 32.

FIG. 3A is a graphic depiction of the amplitude of the clock signal 100 produced at the terminal 42. FIG. 3C illustrates the same signal on a greatly expanded time scale. FIGS. 3B and 3D depict the sequence of the transmission of data on conductor 33. In FIGS. 3A through 3D the horizontal axis is representative of time, while the vertical axis in FIGS. 3A and 3C represents signal amplitude. Additionally, the time scales of FIGS. 3A and 3B are identical, and the time scales of FIGS. 3C and 3D are identical. By viewing FIG. 3C it is apparent that the periodic clock signal comprises, during each period, a leading synchronization (sync) pulse 101 having a relatively long duration of 2 milliseconds followed by twenty-seven short duration pulses 102 each having a 90 microsecond duration and a fixed period of 180 microseconds. These pulses are then followed by twenty-three 90 microsecond pulses having a fixed period of 1.8 milliseconds. Conventional frequency dividers and logic gates (or the conventional use of microprocessor logic circuits) are contemplated as comprising the timing signal generator 41 and the arrangement of these components so as to create the clock signal 100 shown in FIGS. 3A and 3C is conventional and therefore will not be further described.

Essentially, the clock signal 100 is utilized to coordinate timing between a transceiver chassis multiplex circuit 43 and a microphone chassis multiplex circuit 44 wherein both of these multiplex circuits are understood to comprise controllable gating circuitry which sequentially couples an input/output terminal to various other terminals in accordance with received clock pulses. The sequencing order for these connections is understood to be fixed, and therefore sequencing occurs in a predetermined order in response to each received clock pulse which occurs after the multiplex circuit has received a reset pulse.

In the present embodiment it is contemplated that the microphone chassis 13A houses a digital sync detector circuit 45 which receives the clock signal 100 and provides at an output terminal 46, a reset pulse indicating that the detector has properly identified the long duration sync pulse 101 of the clock signal. A typical embodiment for this digital sync detector is illustrated in FIG. 4 and waveforms illustrating the operation of that circuit are shown in FIG. 5. A detailed description of the operation of the digital sync detector will be presented subsequently.

In response to a reset pulse being generated at the terminal 46, which is coupled to a reset terminal of the multiplex circuit 44, the multiplex circuit then proceeds to connect an input/output terminal 47 to a plurality of terminals coupled to the multiplex circuit in a predetermined sequence at times dictated by the reception of subsequent clock pulses received through a connection 48 between a clock terminal of the multiplex circuit 44 and the clock pulse supplying conductor 32.

For the multiplex circuit 44 the sequence of these connections is generally clockwise as shown in FIG. 2B resulting in connecting the terminal 47 sequentially to terminals $T'_2$ through $T'_{17}$ and then through terminals $R'_2$–$R'_4$, $R'_6$–$R'_8$, and then to terminals $A'_1$ and $A'_2$ for a total of six cycles. Subsequently, another reset pulse is produced at the terminal 46 by the detector 45 processing the periodic clock signal 100 on the line 32 and detecting the next sync pulse and the operation of the multiplex circuit 44 is recommenced. Multiplex circuits such as the circuit 44 are well known and merely comprise a number of sequentially closable gates. Integrated circuits implementing the function attributed to the multiplex circuit 44 are readily available and therefore the details of this multiplex circuit will not be further discussed.

The terminals $T'_2$ through $T'_{17}$ are coupled to a latchable register 48. The function of this register is merely to insure that the signals sequentially presented to the terminals $T'_2$ through $T'_{17}$ are latched so as to provide a latched output to a driver stage 49. This is done so as to insure that the driver 49 will continuously receive inputs corresponding to the switched inputs provided at the terminals $T'_2$ through $T'_{17}$ even when the multiplex circuit 44 is connecting other terminals to the input/output terminal 47. Many standard latching circuits can perform the function of the latch register 48, and FIG. 2B indicates that perhaps the latch register may require timing inputs related to the reset pulse produced at the terminal 46 and the timing pulses of the clock signal 100 on line 32. It is also contemplated that the multiplex circuit 44 could inherently provide latched outputs at its own output terminals $T'_2$ through $T'_{17}$ and thereby eliminate the need for a separate latch register 48 which supplies latched inputs to the driver 49.

The driver 49 is coupled to an illuminated visual digital display comprising two seven segment integral display modules. Essentially the signals at the terminals $T'_2$ through $T'_{15}$ determine the excitation state of the two seven segement displays 22 and 23. In accordance with the control signals sequentially produced at the terminals $T'_2$ through $T'_{15}$ the display modules 22 and 23 can be made to visually illustrate any numeric or alphabetic two character display in a manner which is well known to those of skill in the art. It is contemplated that the signals supplied to the terminals $T'_2$ to $T'_{15}$ comprise a multiple bit digital binary (two state) code to selectively control the excitation of the displays 22 and 23. The driver 49 merely supplies a power drive signal for these display digits. In addition, the signals at the terminals $T'_{16}$ and $T'_{17}$ are coupled through the latch register 48 and driver 49 and are supplied as driving inputs for LEDs corresponding to the memory and scan indicating LEDs 24 and 25, respectively. Thus it is contemplated that the multiplex circuit 44 will receive a multiple bit digitally coded word wherein the occurrence of the logic states of each bit of this word as compared with the occurrence of pulses on the clock signal 100 will result in providing latched display information to drive the displays 22 through 25 to thereby indicate the channel selection and mode of channel selection operation of the transceiver 10.

The R' terminals illustrated in FIG. 2B represent input terminals for the multiplex circuit 44 wherein the signal inputs are dependent upon the actuation state of the switches 15, 18 through 21 and 27. The pushbutton and sliding switches 15, 18–21 and 27 illustrated in FIG. 2B correspond to the components shown in FIG. 1 that have identical reference numbers. It is contemplated that each of the R' terminals will be directly connected to B+ through a relatively high resistor value. This insures that if any of the pushbuttons 18 through 21 and 27 are not being depressed, or if the slide switch 15 is in the position shown in FIG. 2B, a high voltage logic signal will be present at the R' terminals. If these pushbuttons are depressed, or if the side switch 15 is moved to the right, of the position shown in FIG. 2B, then it is contemplated that a low voltage (ground) signal will be provided at these R' terminals. The high resistor to B+ is only illustrated for the terminal $R'_2$ in the interest of clarity, but it is understood that all of the other R' terminals in FIG. 2B are similarly connected.

At the terminal $A'_1$ an continuously variable analog control signal having its amplitude adjustable in infinitely small increments is provided by a potentiometer having its wiper arm positioned by and therefore corresponding to the volume control thumbwheel 17. Similarly, an adjustable potentiometer is provided with a wiper arm positioned by and therefore corresponding to the squelch thumbwheel 16, and this provides a variable magnitude analog control signal at a squelch control terminal $A'_2$. It should be noted that the information supplied to the terminals $T'_2$ through $T'_{17}$ by the multiplex circuit 44, and the information supplied to the multiplex circuit 44 by the manually actuable switches 15, 18 through 21 and 27 at the R' terminals, is all essentially digital in nature in that either a high or low logic two state signal is provided at or provided to these terminals. This should be contrast with the information provided to the terminals $A'_1$ and $A'_2$ which represents analog magnitude control signals having more than three possible discrete magnitudes and preferably having magnitudes adjustable in infinitely small increments.

The operation of the multiplex circuit 44 can be better understood by referring to the waveforms in FIGS. 3A through 3D and noting the table of the order of data transmission provided in FIG. 3E. FIG. 3D illustrates that during the first 18 clock pulses after an identified sync pulse, digital (two logic state) data is transmitted to the microphone chassis 13A, and the table in FIG. 3E identifies this digital information. For the next 9 clock pulses FIG. 3D illustrates that digital information is transmitted from the microphone chassis 13A to the transceiver chassis 11, and this information is likewise identified in the table of FIG. 3E. After this bidirectional transmission of digital two logic state data, the multiplex circuit 44 then repetitively sweeps the terminals $A'_1$ and $A'_2$ a total of six times in response to subsequently received clock pulses. Here the information transmitted over the data line 33 to the transceiver chassis 11 now comprises a variable amplitude analog (more than three logic state) control signal wherein the magnitude of the control signal is preferably variable in infinitely small increments and relates to the setting of the potentiometers corresponding to the controls 16 and 17. After this is accomplished another sync pulse is produced by the periodic clock signal and this results in recommencing the entire sequence of operation. The present invention could be expanded to include the bidirectional transmission of analog data.

In summary, the multiplex circuit 44 periodically results in utilizing information supplied over the data line conductor 33 to excite the visual displays 22 through 25. Then the circuit 44 effectively monitors all of the pushbutton and slide switches present on the microphone chassis 13A and produces a corresponding string of digital logic states on conductor 33. Then circuit 44 effectively monitors the adjustable potentiometers 16 and 17 so as to provide analog data on conductor 33 related to the setting of these potentiometers.

It should be noted that the analog information provided by the potentiometers 16 and 17 located on the remote microphone chassis 13A does not have to undergo a conversion into a digital format in order to be transmitted over the single data line 33. In this manner the expense and complexity of having an analog to digital converter for volume and squelch control signals in the microphone chassis 13A is eliminated by the preferred embodiment of this invention, while the remaining information transmitted over the data line 33 does comprise a multiple bit digital code representative of the type of display to be provided on the microphone chassis and the operative state of pushbuttons and slide switches present on the microphone chassis.

It should be noted that it is the entire cycle period of the clock signal is contemplated as being of a relative short duration (49.97 milliseconds according to the table in FIG. 3E). Thus the present invention contemplates successfully identifying even momentary actuations of any of the pushbuttons or the two position slide switch present on the microphone chassis 13A.

FIG. 2A illustrates the electronics in the transceiver chassis 11 which generates the visual display information on line 33 for controlling the displays 22 through 25 on the microphone chassis 13A and which receives control information supplied from the microphone chassis 13A along the common data line 33. The operation of this circuitry will now be explained in detail. While the circuitry illustrated in FIG. 2A will be explained with respect to conventional logic block embodiments illustrated in FIG. 2A, it should be noted that preferably the majority of the logic functions provided by the circuitry external to the transceiver block 28 shown in FIG. 2A is contemplated as being included in a microprocessor contained in the transceiver chassis 11. This microprocessor would act like a miniature computer in that it would receive all of the information provided by the remote microphone chassis 13A, process this information in order to make appropriate logic control decisions, and, in response thereto, supply display information to the microphone chassis 13A along the common data line 33.

As illustrated in FIG. 2A, the transceiver chassis circuitry includes the master clock 40 and timing signal generator 41 which supply the clock signal (FIGS. 3A and 3C) at the terminal 42 which is coupled via the conductor line 32 to the microphone chassis 13A. It is contemplated that a digital sync detector 50 identical to the detector 45 in FIG. 2B receives this clock signal and produces at an output terminal 51, corresponding to the terminal 46, sync pulse identification pulses that are received at a reset terminal of the multiplex circuit 43. In addition, the clock signal is also received at a clock terminal of the multiplex circuit 43 which has an input/output terminal 52 connected to the common data line 33. The B+ line 34 and ground line 35 are also received by the multiplex circuit 43.

The operation of the multiplex circuit 43 is essentially identical to that of the multiplex circuit 44 except that for the circuit 43 the input/output terminal 52 is sequentially connected in a counter-clockwise manner to terminals T2 through T17, R2-R4, R6-R8 and A1 and A2, respectively, for each additional clock pulse received after the identification of a sync pulse by the detector 50. Thus the multiplex circuit 43 merely comprises sequentially closable gates that are controlled by the received clock pulses and the manner of operation of this circuit is identical to that of the circuit 44.

At the terminals T2 through T15, a decoder circuit 53 produces binary coded logic signals which control the excitation of the seven segment displays on the microphone chassis 13A. The decoder 53 receives this information via a connection 54 to the output of a read only memory (ROM) 55 which is contemplated as suppling a binary coded output to both the decoder 53 and a digital frequency synthesizer 55A.

Digital frequency synthesizers operative in response to a binary coded output of a ROM are well known and therefore a detailed discussion of the structure of the synthesizer 55A is unnecessary. Essentially, the synthesizer receives a binay coded input signal which controls the divide by relationship of a phase locked loop internal to the synthesizer that results in controlling the frequency of an output signal which in the present case is supplied as a mixer input signal to the terminal 28A of the transceiver block 28. In this manner the synthesizer 55A controls the tuning of the transceiver block 28 in accordance with the digital output signals of the ROM 55, while the decoder 53 translates this binary coded code into binary drive signals which are utilized to control the excitation of the channel indicating seven segment displays on the microphone chassis 13A. An example of such a synthesizer is shown in U.S. Pat. No. 4,135,158.

Terminals T16 and T17 of the multiplex circuit 43 receive input control logic state signals from a control logic circuit 56. This control logic circuit 56 receives logic inputs from the terminals R2, R3, R4, R6 and R8 and essentially determines what mode of operation for the transceiver 10 is desired by the operator of the transceiver. In other words, the control logic circuit 56 serially receives input control signals provided by the manual controls on the microphone chassis 13A and decodes these manual control signals to determine the desired mode of operation of the transceiver.

Figure 6A:
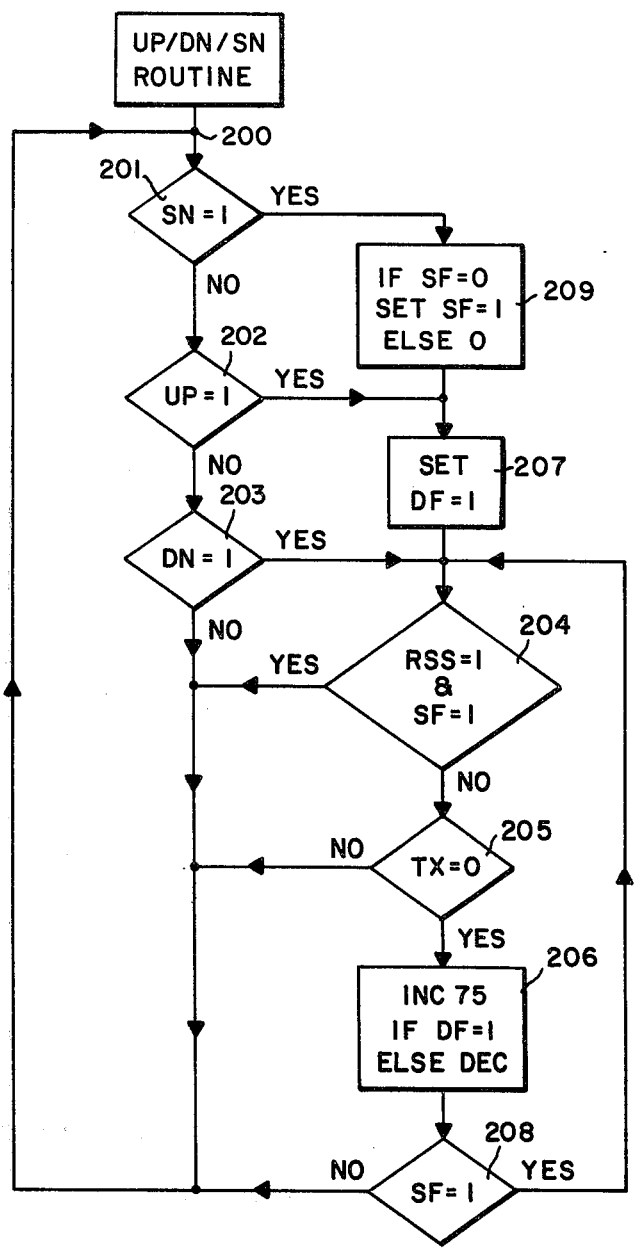
FIGS. 6A and B are flow charts illustrative of one of the block components shown in FIG. 2.

The construction of the logic control 56 essentially comprises various logic gates, logic circuitry such as holding registers similar to register 48 and timing circuits which will enable the control logic circuit 56 to determine in which order the manual controls on the microphone chassis 13A have been actuated. The control logic circuit 56 also is coupled to terminal 51 in order to receive the clock signal 100 to aid the logic circuit 56 in determining the order and duration of actuation of the pushbuttons on the microphone chassis 13A. Flow charts illustrative of the control logic circuit 56 are illustrated in FIGS. 6A and B and will be discussed subsequently as will the significance of the order of actuation of the manual controls on the microphone chassis 13A.

Terminal R7 of the multiplex circuit 43 is coupled to a receive and hold circuit 57 shown dashed. The embodiment for the circuit 57 shown in FIG. 2A represents the preferred embodiment for sample and hold circuits 62 and 63 which process volume and squelch control signals, but is not necessarily the optimum circuitry for processing the noise blanker control signal at terminal R7. The receive and hold circuit 57 comprises an MOS field effect transistor (FET) 58 having its gate terminal directly coupled to the terminal R7 and also coupled to ground through a relatively large magnitude holding capacitor 59. The source of the FET 58 is connected directly to B+ and the drain is connected to an output terminal 60 and is also connected to ground through a resistor 61.

Essentially, when noise blanking information is multiplexed to the terminal R7 such that the output at this terminal is representative of whether or not noise blanking actuation is desired, this information results in charging or discharging the capacitor 59. After the multiplexing has resulted in charging or discharging the capacitor 59, the charge on the capacitor is maintained since the connection to the terminal R7 through the multiplex circuit 43 is then open circuited and the capacitor 59 cannot discharge into the high input impedance of the FET device 58. However, the FET device 58 does provide a driving output at the terminal 60 which is related to the charge on the capacitor 59. In this manner, the receive and hold circuit 57 receives the information from the multiplex circuit 43 and provides an output at the terminal 60 having a magnitude related to the amplitude of the received signal, and this amplitude is maintained until the next multiplexing (updating) of information to the terminal R7. Thus essentially the circuit 57 forms an analog latching circuit and provides a control output at the terminal 60. The terminal 60 is directly connected to the noise blanking terminal 28B of the transceiver block 28, although this connection is not shown in FIG. 2A for the purpose of clarity.

The terminals $A_1$ and $A_2$ which receive variable amplitude analog control signals, during the proper multiplexing time period, representative of the setting of the analog controls 16 and 17 on the microphone chassis 13A are coupled to receive and hold circuits 62 and 63, respectively, which provide output analog control drive signals at output terminals 64 and 65, respectively. These terminals 64 and 65 are directly connected to control terminals 28C and 28D of the transceiver block 28, although these connections are also not shown for the purpose of clarity. The receive and hold circuits 62 and 63 are identical to the circuit 57 shown in FIG. 2A.

During the multiplexing time at which analog signals having variable amplitudes are connected to the terminals $A_1$ and $A_2$ by the multiplex circuit 43, the charge on capacitors internal to the circuits 62 and 63 is varied in accordance with these analog signals. At other times during the operation of the transceiver 10, a fixed magnitude control signal amplitude is provided at the terminals 64 and 65 representative of the received amplitude at the terminals $A_1$ and $A_2$, respectively. The amplitude of the signals at the terminals 64 and 65 is maintained constant until the next reception of analog signal amplitude information at the terminals $A_1$ and $A_2$ from the multiplexing circuit 43. This results in always providing analog volume and squelch information to control the transceiver 28, and this is accomplished without converting the analog control information first produced at the microphone chassis 13A into digital information and then transmitting this digital information via cable 14 to the transceiver chassis 11.

If the analog volume and squelch information had been converted into digital information, then an inherent loss of resolution of the analog information would have occurred. The present transceiver system avoids this loss of resolution by multiplexing the analog control signals along with digital drive signals between the transceiver chassis 11 and microphone chassis 13A. The present system also provides for lessening the cost of the transceiver 10, since analog to digital convertors are not required in the microphone chassis.

The operation of the logic control circuit 56 will now be described with respect to its interaction with various other components in the transceiver chassis 11.

Essentially the logic control circuit 56 receives inputs from the terminals R2, R3, R4, R6, and R8 and provides outputs at the terminals T16 and T17 indicating whether a tuning memory mode or "normal" tuning mode has been requested by the manual controls on the microphone chassis and/or whether a channel scanning mode of operation has been requested by the controls on the microphone chassis, respectively. In addition, the logic control circuit 56 provides an output at a terminal 66 indicative of whether the push-to-talk switch 27 is being depressed. Also, control circuit 56 provides an output signal at terminal 67 (INCR) which indicates whether a change in the transceiver channel frequency is desired, and circuit 56 provides an output signal at a terminal 68 (U/D) which indicates whether the channel frequency changes should occur in an upward or downward direction.

Load and clear commands are produced by circuit 56 at terminals 69 and 70, respectively, wherein these commands result in loading or clearing specific memory locations in a storage register and logic circuit 71 which receives inputs from these terminals as well as receiving a logic input signal from terminal T16. The storage register and logic circuit 71 also provides outputs at terminals E and F which are coupled both to the decoder 53 and to the control logic circuit 56. The signal at the terminal E is a logic signal which indicates if all of the possible channel storage locations in the storage register and logic circuit 71 are blank when a signal at T16 indicates the tuning memory mode has been requested and the logic signal at the terminal F indicates whether all of the possible channel storage locations in the storage register and logic circuit 71 are loaded with specific channel frequencies and a load command has been generated at terminal 69.

The storage register and logic circuit 71 is intended to store, in five programmable storage register locations, information identifying a maximum of five preferred communication channels for the transceiver 10. Logic circuitry internal to the register and logic circuit 71 monitors whether or not these five channel indication storage locations have been filled or not and produces in response thereto, and in response to the signals at terminals T16 and 69, the logic output signals at the terminals E and F. Elementary logic circuits can be utilized to monitor whether five storage register locations storing channel identifying information have or have not been filled, and therefore a detailed discussion of the operation of this portion of the storage register and logic circuit 71 is not believed necessary. Similarly, constructing a storage register which loads and clears various storage locations upon receipt of load and clear commands from a control circuit is also within the knowledge of those of average skill in the art and a detailed discussion of the structure to accomplish this result is also believed to be unwarranted. Also, logic circuitry in the circuit 71 which generates the E and F signals in response to the coincidence of two signals indicative of different conditions is also within the ability of those of average skill in the transceiver design art and requires no further explanation.

The increment command (INCR) produced at the terminal 67 is received at a control terminal 72 of a gate 73 which selectively passes counting pulses from a master fixed frequency oscillator 74 to an up/down counter 75 and a gate 76. The up/down counter 75 receives its counting direction information via a direct connection to the up/down terminal 68 which is also selectively coupled through gate 76 to the storage register and logic circuit 71 along with pulses selectively coupled from the gate 73 through gate 76. The passing of signals through the gate 76 is controlled by logic signals received at a control terminal 77 of the gate 76 which is directly connected to the terminal T16 which indicates that a memory mode of operation has been selected by the controls on the microphone chassis 13A and that this mode request has been recognized by the control logic circuit 56.

The count of the up/down counter 75 is coupled as an input to a gate 78. The gate 78 has a control terminal 79 coupled to the terminal T16 which results in altering the function of this gate in response to whether or not a tuning memory mode of operation has been recognized by the control logic circuit 56. In the "normal" tuning mode of transceiver operation, the gate 78 will pass the count of the counter 75 through it as an input to the read only memory 55. In addition, the count of the counter 75 is passed through the gate 78 as an input to the storage register and logic circuit 71. When a memory mode has been indicated at terminal T16 by the logic control circuit 56, then the gate 78 does not pass the count of the counter 75 to the ROM 55, but instead passes counts stored in the storage register and logic circuit 71 through the gate 78 as an input to the ROM 55. The gate 78 can be readily implemented by standard logic circuit components.

The operation of the control logic circuit 56 and the channel determining circuitry basically comprising the counter 75 and storage register and logic circuit 71 will now be briefly summarized. Subsequently their operation will be described in detail.

Essentially, the control logic 56 receives command signals at terminals R2–R4, R6 and R8 from the multiplex circuit 43 and determines the existence and time occurrence of these command signals to identify whether the up/down counter 75 (in the normal tuning mode) or the storage register and logic circuit 71 (in the tuning memory mode) should control the signal inputs to the ROM 55 which in turn determines the control input to the digital frequency synthesizer 55A that determines the mixing frequency for the transceiver which thereby determines the communication channel selected for transceiver operation. The circuit 56 provides a signal output at terminal T16 indicative of the tuning mode of the transceiver, and decoder 53 provides channel indicative display signals at terminals $T_2$–$T_{15}$.

It is contemplated that while an identical communication channel will be indicated for both receive and transmit conditions by the channel displays 22–23, of course the output of the digital frequency synthesizer will vary between receive and output modes of operation to account for the IF offset frequency. This mode of operation is well known to those skilled in the art and is accomplished in the present invention by having the ROM 55 receive an additional input from the terminal 66 which indicates that the control logic circuit 56 has identified that the push-to-talk switch is being depressed thereby indicating that a transmitting mode of operation is desired.

When the control logic 56 has determined that a memory mode of operation is not be be implemented, via the absence of a signal at the terminal T16, this means that the output of the up/down counter 75 will determine the input to the ROM 55 which in turn determines the communication channel at which the transceiver will operate. In this mode of operation, termed the "normal" mode of transceiver channel selection (tuning), momentarily depressing either the up or down pushbutton switches 20 or 18, respectively, results in producing an increment command (INCR) at the terminal 67 that results in the gate 73 passing one clock pulse to the up/down counter 75 while the up/down control signal at the terminal 68 tells the counter whether to increment in an upward or downward direction. Continuous depression of the up or down controls 20 and 18 for longer than 500 milliseconds will cause the count of the up/down counter 75, which determines the operative communication channel (also termed "active channel") of the transceiver 28, to be slewed up or down at a rate of four channels per second by continuously passing pulses from the oscillator 75 to the counter 75 till termination of the depression of the up or down pushbuttons.

The control logic circuit 56 determines the duration of the depression (activation) of the up and down pushbuttons by counting the number of consecutive times logic signals are produced at the terminals R2 and R8, since logic signals are multiplexed to these terminals at a fixed rate determined by the clock signal at terminal 42. The control logic circuit 56 determines the duration and sequence of actuation of other manual switches in a similar manner by utilizing the timing relationship created by the clock signal 100 between the various multiplexed signals.

It is contemplated that the transceiver 10 is a CB transceiver having 40 possible communication channels, thus the sequence of active channel incrementation in the normal tuning mode of operation will be 38, 39, 40, 1, 2 . . . etc. continuously over the forty possible CB channels. A continuous depression of either the up or down manual pushbutton control results in slewing the count of the up/down counter 75 in the normal mode of operation. In the tuning memory mode of operation depression of the up or down manual pushbutton switches 18 and 20 will result in having the storage register and logic circuit 71 slew over any channel indicating information that it has stored in its maximum of five channel indicating storage spaces. Depression of either of the pushbuttons 19 or 21 will be ignored by the control logic circuit 56 as long as either an up or down command is present caused by the depression by the pushbuttons 20 or 18. However, actuation of the push-to-talk pushbutton 27 or actuation of a transceiver on-off command switch which may also be located on the microphone chassis will override any up or down commands.

If a scan mode has been selected by depressing the scan pushbutton 19 in the normal mode of operation, this commences continuous automatic incrementing of the up/down counter 75 until an active channel signal is actually received by the transceiver 10 wherein this incrementing proceeds through all of the regular 40 CB channels in sequence at a rate of four channels per second. Upn reception by the transceiver of an active channel signal in the scan mode, the incrementing of the counter 75 is halted. This can readily accomplished by connecting the squelch or AGC signal as an additional control input for the gate 73.

If the scan pushbutton 19 is depressed while the transceiver is in the memory mode of operation, then automatic continuous scanning in a similar manner is implemented, but now it is the five channel storage locations in the storage register 71 which are automatically incremented. Only storage register locations which contain channel indicating information are contemplated as being scanned, and blank storage locations are skipped. Four seconds after termination of the AGC or squelch indicating signal which has identified the reception of a received signal, continuous automatic scanning of the five storage locations will automatically resume.

Each depression of the scan pushbutton 19 is intended to alternately activate and deactive the scan mode, and the control logic 56 will sense the state of the pushbutton 19 via the signal at terminal R4 and determine this alternate scan activation and deactivation, preferably through the use of flip-flop circuits. The existence of the scan mode is indicated by the control logic circuit 56 providing an excitation signal to the terminal T16 which is utilized to excite the scan LED 25 contained on the microphone chassis 13A.

The scan mode, besides being alternately activated and deactivated by depression of the scan selecting pushbutton 19, is also deactivated by a depression of the function (FN) pushbutton 21 or any actuation of the push-to-talk pushbutton 27. The control logic circuit 56 can readily implement this function by using a flip-flop to implement the scan mode, and using the activation of other pushbuttons to reset the flip-flop. This type of operation is fully described in copending U.S. patent application Ser. No. 005,544, filed Jan. 22, 1979, hereby incorporated by reference, and assigned to the same assignee as the present invention.

While the transceiver is in the scan mode of operation, assuming that signals are not being received by the transceiver on the channels that are being scanned, depression of the up or down pushbuttons 19 and 18, respectively, will have no effect. During the scan mode, if the incrementation of the counter 75 or storage register 71 has been halted by the reception of a signal on the scanned channel, then actuation of the up or down pushbuttons will result in additional incrementation of either the counter 75 or storage register 71. In this case the incrementation will not begin until the up or down pushbuttons have been released. After incrementation caused by the actuation of the up or down pushbuttons in the scan mode, the scan incrementation will automatically resume from the last communication channel provided by the actuation of the up or down pushbuttons.

The Motorola "Electroscan" receiver model CM540 has circuitry which accomplishes substantially all of the above described scan mode features, and since this radio, its schematic and technical manual are publicly available, the implementation of the above described scanning features is considered to be within the ability of those of average skill in the art.

Actuation of the push-to-talk switch 27 will cause the control logic circuit 56 to terminate the scanning mode if the system is in that mode. If the push-to-talk command is present for longer than 250 milliseconds then the control logic 56 will recognize this as a proper transmit command and will produce a logic signal at the terminal 66 altering the input to the ROM 55 and thereby changing the ROM output from a receive frequency determining code to a transmit frequency determining code, while the input to the decoder 53 remains the same. As long as the push-to-talk command is present, no other commands from the microphone chassis 13A will be accepted except for a turning off of the entire transceiver.

Access to "second level" commands which can be implemented by the present transceiver will now be described. The function (FN) pushbutton 21 is actually a mode or second command level access button which allows the subsequent actuation of the pushbuttons 18 through 20 to implement second level commands. Depressing the FN button 21 followed by a depression of the UP pushbutton 20 will be recognized by the control logic 56 as a request to implement a tuning memory mode. Depressing the FN button 21 and then the DN pushbutton 18 is recognized by the control logic 56 as requesting the counter 75 to produce a preset count which results in automatically having the ROM 55 and digital synthesizer 55A tune the transceiver to channel 9. Depressing the function button 21 and then depressing the scan button 19 results in a dual load/clear command wherein the control logic circuit 56 interprets this as either a load command or a clear command depending upon whether or not the transceiver 10 is in the tuning memory mode. The load/clear commands will be explained in detail subsequently.

The FN command, created by actuation of pushbutton 21 being sensed by control logic circuit 56, enables the second level of commands which can be implemented by the present invention, and this command is cancelled if another command does not follow within 2 seconds. The FN command is also cancelled after a second level command has been received. However, another FN command within 2 seconds will just reenable the access to the second level of commands.

Implementation of the tuning memory mode by control logic circuit 56 first sensing the depressing of the FN pushbutton 21 and then the depressing of the UP pushbutton 20 within 2 seconds will result in, via the signal at T16, enabling the gate 78 to access any of the channel storage information contained in the storage register 71 and selectively supply this information, one channel at a time, as input information to the ROM 55. When the memory mode is entered, the control logic 56 will also provide an excitation signal to the terminal T16 that also results in turning on the memory mode indication LED 24 on the microphone chassis 13A. When entering the memory mode, the communications channel which the transceiver 10 is tuned to will be the last active channel that was supplied by the storage register 71.

The tuning memory mode can be cancelled by recreating a memory command due to the sequential depression of the pushbuttons 21 and 20. Upon termination of the memory mode the transceiver will be tuned to the last active channel which was determined by the count of the up/down counter 75 and at the same time the LED 24 will be extinguished. In the memory mode, only one of the five storage locations in the storage register 71 is supplied through the gate 78 as an input to the ROM 55. Depressing either the up, down or scan pushbuttons when the transceiver is in the memory mode will result in incrementing which one of the five storage locations in the storage register 71 will supply inputs through the gate 78 to the ROM 55. If any of the storage locations in the storage register 71 do not contain channel identifying information, they cannot be accessed. This will occur whenever any of these locations are blank (unprogrammed or cleared). If the transceiver is in the scan mode, then attempting to enter or exit the memory mode will terminate the scan mode.

The tuning memory mode cannot be accessed if all storage locations in the storage register 71 are clear (do not have any channel indicating information). If this is attempted, the storage register logic circuit 71 will produce a signal at the terminal E. This results in supplying an input to the decoder 53 which will alter the binary signals at the terminals T2 through T15. This will result in the seven segment display module 23 on the microphone visually displaying an alphabetic "E" indicating the entire storage register 71 is empty. Also, the signal at the terminal E will be received by the control logic circuit 56 and result in having this circuit continue to provide an excitation signal to the memory LED 24 for two seconds which coincides with the time duration that the "E" will be displayed on the display module 23. After this two second delay the channel indicating displays 22 and 23 will again display the correct numeric communication channel that the transceiver is tuned to. The channel identification information supplied by the counter 75 to the ROM 55 will not change during this attempted access of the memory mode, and the input to the ROM 55 will also not change during the subsequent two second display of the "E". All commands, except commands related to movement of the noise blanking switch 15, will be ignored during the display of the E and simultaneous excitation of the memory LED 24. This feature of the present invention provides for alerting the operator of the transceiver, by a distinctive visual display, that he has attempted to access channel indicating information in the five storage locations in the storage register 71 and that no such channel indicating information is present in that register.

The creation of a second level "channel 9" command caused by sequential depression of the FN and DN pushbuttons automatically tunes the transceiver to channel 9. This can be accomplished by merely supplying the ROM 55 with a predetermined input under this condition where the predetermined input can be merely either an additional fixed channel indication storage location which is part of the storage register 71, or a preset count of the counter 75. The previous active channel and previous tuning mode of operation of the transceiver (memory or normal) which existed before going to channel 9 can be recalled by a single depression of the FN pushbutton. A channel 9 command will take the system out of the tuning memory mode. After a channel 9 command has been implemented, depression of the up or down pushbuttons will cause the communication channel of the transceiver to be incremented or decremented from channel 9. If this occurs then another depression of the FN pushbutton after depression of the up or down pushbuttons will not result in the recall of the previous active channel and this depression just again serves as an enabling command which enables access to the second level of commands. After the implementation of a channel 9 command, if the scan sequence is activated by depression of the SN pushbutton, incrementation then begins from channel 9. Depression of the FN command after the scan has been activated from channel 9 again will not recall the previous memory channel. These features can be readily implemented by presetting the counter 75 to channel 9 immediately after up/down or scan commands are implemented after a channel 9 command has been implemented and then allowing the counter 75 to increment or scan in either desired tuning mode of operation.

If the transceiver is operating in the tuning memory mode wherein the five programmable storage locations in the storage register 71 determine the inputs to the ROM 55, then the implementation of a "LD/CL" command (a load/clear command created by the sequential depression of the FN and SN pushbuttons) becomes a "clear" command. This is interpreted by the logic control circuit 56 as a command which will erase the contents of the one storage register location of the register 71 which was supplying information to the ROM 55, and this increments the storage register 71 such that a next channel identifying filled location of the storage register 71 will now supply a frequency selecting input to the ROM 55. If all locations in the stack of five storage register locations of the register 71 are cleared, then the transceiver will automatically revert to the normal tuning mode of operation. The frequency which will be reverted to will be the last channel that was used during the previous operation of the normal tuning mode of the transceiver and this will be determined by the count of the counter 75. While the counter 75 will now supply the input to the ROM 55 after the last storage location of the register 71 has been cleared, the control logic circuit 56 and the storage register and logic circuit 71 will combine to visually display an alphabetic "E" and continue the excitation for the memory LED 24 for two seconds. This indicates to the transceiver operator that the normal mode of transceiver channel selection operation will now be resumed since all five programmable storage locations in the storage register and logic circuit 71 have been cleared (emptied) of channel identifying information.

In the normal tuning mode of operation, the second level command "LD/CL" becomes a load command. This means that the count of the up/down counter 75 which identifies the channel to which the transceiver is tuned is now loaded into the last cleared storage location in the storage register and logic circuit 71. If this last cleared location already has channel information in it, the channel identifying information will be loaded into the next highest clear storage memory location in the storage register 71. When channel identification information is successfully loaded from the counter 75 into one of the five storage locations in the storage register 71, the visual display provided by the seven segment modules 22 and 23 will be blank for 500 milliseconds and then the display will return to display the correct channel to which the transceiver is tuned.

If all five memory locations of the storage register 71 are full, then no additional channel identifying information can be loaded into the storage register 71. Any attempt to do so will result in the storage register 71 producing a logic signal at the terminal F. This signal is coupled to the decoder 53 and results in the visual display modules 22 and 23 displaying an alphabetic "F" indicating that all storage locations in the programmable storage register 71 are full. This display is maintained for a time of 2 seconds, after which the control logic circuit 56 terminates the "F" display. During this two second period the ROM 55 continues to receive the count supplied by the counter 75 and thus the channel to which the transceiver is tuned will not change. All digital commands (except a noise blanking command) received through the data line 33 are ignored during the display of a F or when the channel indicating display is being blanked to indicate the correct loading of channel identifying information into the storage register 71.

By having the transceiver refuse to erase channel identifying information in the storage register 71 by attempting to load more channel information into the register than the register can hold, the present system prevents any accidental erasing of channel identifying information in the storage register. This is because only when the transceiver is in the tuning memory mode of operation and the channel identifying information is being displayed by the visual display modules 22 and 23 can the information in the storage register 71 be erased. Any other mode of operation which would allow loading channel identifying information into the storage register 71 by erasing previous channel identifying information once the register 71 is full would run the risk of having the operation of the transceiver unknowingly erase pertinent channel identifying information from the storage register 71. More significantly, in systems of the present type wherein the display only indicates the channel information to be loaded into the storage register, and such erasing of channel indicating information from the storage register 71 would occur without any notification to the operator of the transceiver as to which channel identifying information had been erased. The present invention by providing the "F" information display insures that the transceiver operator knows when all storage locations in the programmable storage register 71 have been filled with channel identifying information, and that therefore the operator must erase, by generating a clear command, one of the five storage locations in the register 71 in order to load any additional channel identifying information into this register.

The features of the present invention involving the display of "E" and "F" indicating the emptiness and fullness of the storage register 71 are significant, since prior systems did not provide a single visual indication which indicated the emptiness or fullness of the entire sequence of programmable storage register locations possible for supplying channel identifying information. The essence of this feature is that out of the forty possible CB channels, the transceiver operator can program five channels by identifying these five channels and storing channel identifying information in five memory locations in the storage register 71. In a tuning memory mode of operation the storage register 71 having the five channel identifying information can be accessed such that the transceiver will now automatically scan or sequentially step through only these 5 channels. The present invention provides for loading any of the 40 CB channels into the storage register 71 and for deleting any of the stored channel information from the register 71. The present invention also provides a distinctive visual display, in the form of an alphabetic E, which indicates whenever all channel identifying information has been deleted from the storage register 71 when the transceiver is in the memory mode of operation. An additional distinctive visual display comprising an alphabetic F is also implemented whenever the transceiver operator attempts to load additional channel identifying information into the storage register when the storage register has no more storage space for this additional information.

The present invention utilizes the same display means which is utilized to indicate in digital numeric form the channel to which the transceiver is tuned for also indicating the E and F displays, and in fact the exact same seven segment modules utilized to display the active channel to which the transceiver is tuned are also utilized for displaying the E and F.

In addition, the present transceiver provides for utilizing common manually actuable pushbutton switch means, comprising the sequence of actuating the pushbuttons FN and SN (21 and 19), for transferring channel identifying information into the storage register 71 when the transceiver is in normal tuning mode, and, when the transceiver is in the tuning memory mode, to utilize the same sequential actuation of the same pushbuttons to delete the contents of one of the storage locations in the storage register 71. This dual use of existing pushbuttons minimizes the number of pushbutton controls which are required on the microphone housing 13A and therefore simplifies operation of the transceiver as well as reducing cost of the transceiver since additional pushbuttons are much more costly than providing logic circuits which are part of a microprocessor that merely decodes the sequential occurrence of pushbutton actuations. In addition, by reducing the number of manual controls needed on the microphone, the present invention gives the microphone an uncluttered appearance and valuable space on the microphone is now made available such that the remaining controls and displays on the microphone can be made larger.

It should again be noted that while the present invention has been described with reference to specific known logic elements and blocks as shown in FIGS. 2A and 2B, the perferred embodiment of the present invention envisions the use of a microprocessor which essentially performs all the functions of all of the circuits in FIG. 2A with the exception of the digital frequency synthesizer 55A, the transceiver block 28 and its antenna and speaker, and the receive and hold circuits 57, 64 and 65. It should be noted that while the control logic circuit 56 is stated to provide specific output logic functions in response to specific input logic occurrences, every single one of these functions as described herein can be implemented by individual logic blocks. By utilizing a microprocessor to perform these functions, this merely reduces the cost of the control logic circuit 56 by allowing for the mutliple use of certain logic blocks. Every logic function described herein has been implemented through the use of a custom microprocessor IC. Flow charts for the logic operations performed by a microprocessor which would implement the control logic circuit 56 are illustrated in FIGS. 6A and B.

Since the use of microprocessors in radio transceivers is known, as for example is shown in U.S. Pat. No. 4,147,984, and since the flow charts in FIGS. 6A and B could be readily utilized by an integrated circuit design house to fabricate a custom microprocessor which performed according to the specifications recited herein, the present description is believed to be sufficient to enable a person of average skill in the art to implement all of the features recited in the attached claims.

The following paragraphs illustrate the working relationship between the structure in FIG. 2A, which includes the logic circuit 56, and the operating characteristics of the transceiver. This will be done by analyzing the flow charts in FIGS. 6A and 6B with respect to how they generally implement the functions of the control logic circuit 56.

FIG. 6A is a logic flow diagram for a subroutine which monitors the actuation of the UP, DOWN, SCAN and TRANSMIT switches of the transceiver. All switch closures will be indicated by the existence of a high logic level signal even though this is contrary to the actual operation of the transceiver switches shown in FIG. 2B. The subroutine will essentially sample the closure state of four switches comprising the UP, DOWN, SCAN and TRANSMIT switches, while also sampling a receiver squelch signal "RSS" which is either high or low depending upon whether or not the receiver is currently receiving a signal, respectively. The control circuit 56 in FIG. 2A is contemplated as receiving the RSS signal from the transceiver 28 via a connection which is not specifically shown in FIG. 2A.

Upon entering the subroutine at a first decision making terminal 200, initially assume that all signal levels are in the low logic state. A first logic test is designated by a diamond shaped decision block 201 which tests to see if the SCAN switch signal provided at terminal R4 is in a high or low state. Since all signal levels have been assumed to be low, this will result in transferring the information flow to a second decision making block 202 which investigates the logic state of the UP control signal provided at the terminal R2, and in turn the non-existence of the UP control signal will result in a decision block 203 investigating the logic state of the DOWN control signal provided at the terminal R8. Since all of the investigated logic signals were assumed to be zero, the flow chart routine will then continue back to the first decision making terminal 200, and the process will be reinitiated whereby the terminals R4, R2 and R8 will again be examined by the decision blocks 201, 202 and 203.

Assuming now that the SCAN signal at terminal R4 and the UP command signal at terminal R2 are still zero, but that the DOWN switch 18 has been depressed causing a high logic signal at the terminal R8, the decision block 203 will now cause a decision block 204 to test the magnitude of the RSS level, which is assumed to be low, and also test a SCAN FLAG signal SF which is also assumed low. For this condition the decision block 204 then transfers information for to a decision block 205 which investigates whether the TRANSMIT signal level at the terminal R3 is low. Assuming that this is the case, then an operation block 206 will change the count of the counter 75 by one count. This can be done by controlling the incrementation signal at the terminal 67 and the UP/DOWN count direction signal provided at the terminal 68.

If a DOWN count state was chosen by depressing the switch 18, then a direction flag signal DF present at the terminal 68 will be zero and this will result in having the logic block 206 decrement the count of the counter 75. If an UP count state had been selected by depressing the pushbutton 20, then the decision block 202 would channel the control flow to an operation block 207 which would set the direction flag signal to one, and this would result in incrementing the count of the counter 75. Having the gate 73 pass just one count pulse for each creation of a YES decision by the block 205 resulting in the production of an increment signal at the terminal 67 is readily accomplished by standard techniques and will not be discussed.

After the operation block 206 has altered the count of the counter 75, the logic flow continues on to a decision block 208 which tests whether the SCAN FLAG signal SF has been set to a high logic state wherein the SCAN FLAG signal corresponds to the signal at the terminal T17 produced when the control logic circuit 56 recognizes the depression of the SCAN pushbutton 19. This is accomplished by the decision block 201 identifying the occurrence of a depression of the SCAN pushbutton by analyzing the SCAN signal at the terminal R4, and then having an operation block 209 alternately set and reset the SCAN FLAG signals F. In cases where the SCAN FLAG signal has been set to a high logic state indicating a depression of the SCAN pushbutton causing the implementation of a SCAN mode, then the logic flow from block 208 will be rechanneled to the decision block 204 which reinitiates the combined RSS and SF testing, the transmitter state testing and the counter incrementation as previously described. If the SCAN FLAG signal is zero, then the logic flow reverts back to the input terminal 200 and the control logic circuit 56 reinitiates the operation of the initial inquiries shown in FIG. 6A.

It should be noted that the present specification contemplates multiple testing to verify the correctness of identifications performed by the decision blocks 201–203, and 205. This can be readily accomplished by having internal loops which count the number of sequential occurrences and determine a proper identification only in response to a predetermined number of minimum occurrences.

It should also be noted that the purpose of testing the squelch signal RSS and the TRANSMIT signal at the terminal R3 is to terminate all scanning count changing of the counter 75 whenever the TRANSMIT mode is implemented or when, during a SCAN mode, a strong signal is received on the channel to which the transceiver 28 is tuned.

It should be noted that a similar flow chart (indicated in FIG. 6B) can be readily constructed for the operation of the control logic circuit 56 to describe how this circuit also interrogates the FUNCTION signal FN provided at the terminal R6 in order to provide the memory output at the terminal T16 and control the operation of the memory storage register 71 and other components via the logic signals produced at the terminals 66–70 and the signals at the terminals E and F. Since this flow chart can be readily constructed based upon the description of the desired mode of operation already previously stated, a thorough discussion of the FIG. 6B flow chart illustrating this operation is not believed to be necessary. However, it should be noted that preferably a decision block verifying the existence of a high logic signal FN at the terminal R6 would precede the logic decision block 201 and result in an alternate parallel subroutine similar to the one shown in FIG. 6 for a positive identification of a high logic state for the signal FN.

It should be noted that it is contemplated that the logic decision blocks analyzing the signals at the output terminals of the multiplex circuit 43 are intended to make their investigations in synchronization with the production of the signals at these terminals by the multiplex circuit. This is insured by the connection of the output of the digital sync detector 50 to the control logic circuit 56 and due to the fact that the logic circuit 56 is also contemplated as receiving the clock signal output of the timing signal generator 41 to insure this synchronization.

It should be noted that the flow chart shown in FIG. 6A is merely a portion of the overall flow chart for the transceiver in this multiplex system. It should also be noted that the same end results could be accomplished by many modifications of the flow chart. For example, the first decision block in FIG. 6A could be a test for the RSS squelch signal and TRANSMIT signal at the terminal R3, rather than the SCAN signal at the terminal R4. This will be understood by persons of average skill in the radio design and computer programming arts.

Figure 6B:
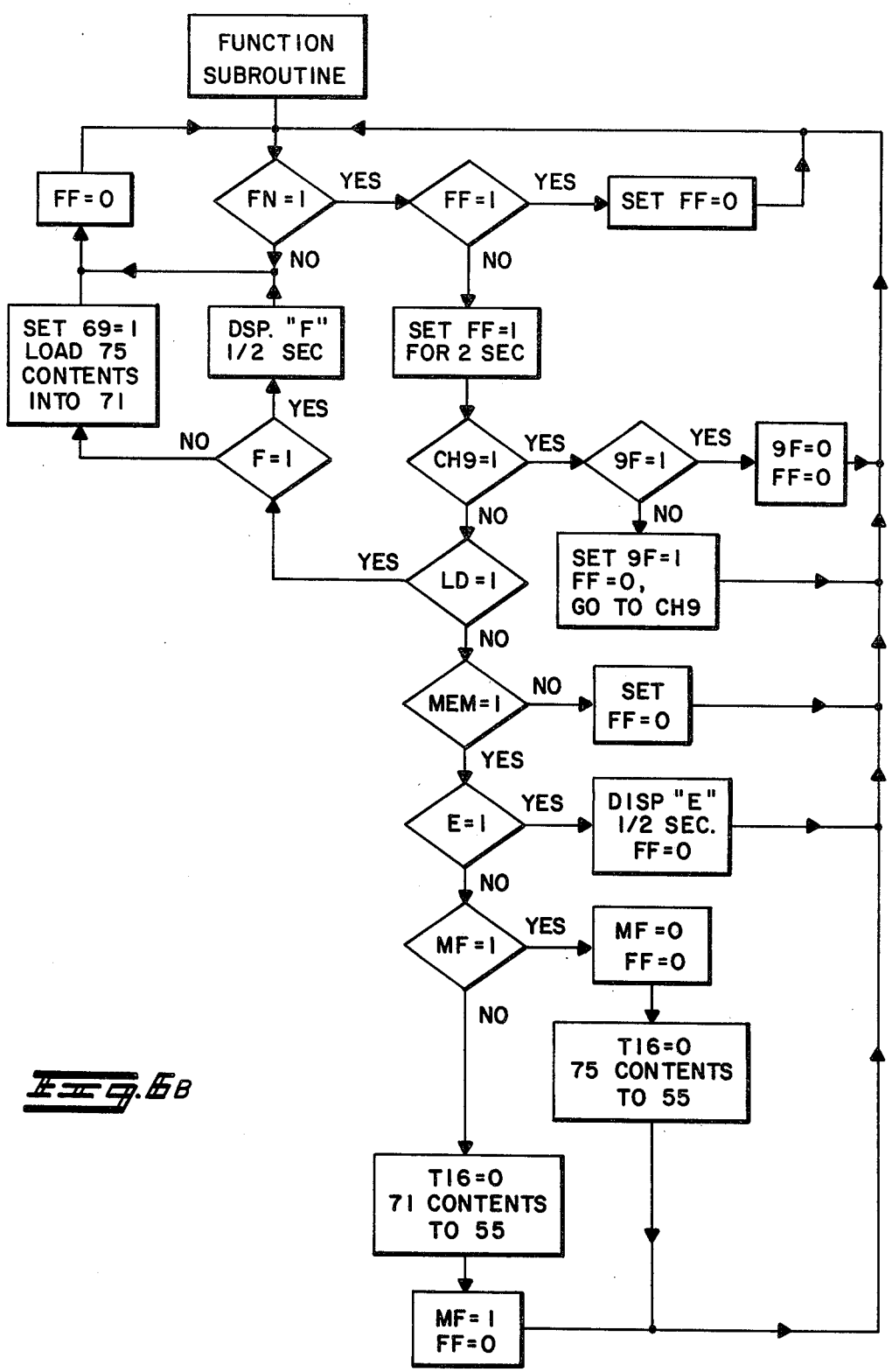

FIG. 6B illustrates the operation of a microprocessor FUNCTION subroutine and is as follows: the microprocessor scans the keys (pushbutton controls) in the following sequence; FUNCTION, CHANNEL 9, LOAD, and then MEMORY and these correspond to pushbuttons 21, 18, 19 and 20, respectively. The initial part of the flow chart tests whether or not the FUNCTION key had been depressed. If the key had been depressed for a sufficient duration, a decision block tests to determine whether or not the transceiver logic was already in the FUNCTION mode. This is indicated by the status of the FUNCTION FLAG signal FF which is alternatively set and reset in response to actuation of the FUNCTION key (pushbutton 21). If the FUNC- TION key had been previously depressed and the FUNCTION FLAG FF had been set to 1 (which indicates the existence of a FUNCTION mode), the FUNCTION FLAG would be reset to 0 and the keyboard scanning sequence would once again commence.

If the FUNCTION FLAG had not been previously set to 1 indicating the existance of a FUNCTION mode, the FUNCTION FLAG is set to 1 for 2 seconds and then a test is then made to determine if the CHANNEL 9 key had then been depressed. If it had, the algorithm would test the CHANNEL 9 flag to determine if you were already in the CHANNEL 9 mode. If you were already in the CHANNEL 9 mode, the CHANNEL 9 flag would be reset to 0, you would clear the FUNCTION flag and return from CHANNEL 9 onto the key SCAN mode. If the CHANNEL 9 flag had not been previously set, you would then set the CHANNEL 9 flag high, the FUNCTION flag low, and then tune the transceiver to CHANNEL 9 (via presetting counter 75 or accessing a count in storage register 71).

Continuing the key scan sequence through the channel 9 key, the next test would be performed in the load key (pushbutton 19). If the load key had been depressed while in the FUNCTION mode, the control logic block 56 would test the F input to indicate whether or not the storage register logic number 71 was full of prior loaded channels. This would be indicated by a high state on the F input corresponding to a 1 state for a full flag F.

The next step in the sequence would be the display of the letter "F" for ½ of a second and then a return to the FUNCTION key scan subroutine. If the full flag (F) was not high, the load signal, at terminal 69, would go high. This would tell the storage register to transfer the contents of the up-down counter 75 to the storage register 71 then return to the key scan routine.

If in the FUNCTION mode the memory key (pushbutton 20) had been depressed, the algorithm would then test the E input to the control logic 56 to determine whether or not the storage register 71 is empty. If it is empty, the control logic will receive a 1 on the E line and display the letter E for ½ of a second and then return to the key scan routine. The next test in memory is to determine whether the MEMORY FLAG (MF, corresponding to the signal at T17) had already been set high or low. If it had already been set high, indicating that you were already in the MEMORY mode, the next step would be to reset the memory flag low, reset the function flag low, and return to the key scan routine. If the memory flag had been set low, indicating that you were not in memory, it would then set terminal T16 high and transfer the contents of the storage register 71 to ROM 55 rather than use the count of counter 75. This would be followed by setting the MEMORY FLAG high while setting the FUNCTION flag low and returning to the FUNCTION key scan routine.

FIGS. 6A and 6B are only part of the overall controlling algorithm. These two flow charts can be merged in a variety of ways to obtain the same operation but by a different path. It is not intended here to portray a detailed exact flow chart, but only illustrate the concept behind the final algorithm. The same end results could have been accomplished by modifying the flow chart in some other manner. For example, the first decision point could be to test the squelch and transmit keyboard inputs first and not scan the other keyboard inputs in the event that either of these signals were in their high state.

A specific embodiment for the digital synchronization pulse detector 45, which is stated to be identical to the detector 50, will not be discussed. This embodiment is illustrated in FIG. 4.

Essentially at a terminal labelled A corresponding to the terminal 42, the clock signal 100 shown in FIGS. 3A and 3C is received. This clock signal is coupled through an invertor 90 to a reset terminal 91 of a counter 92 having a maximum count capacity of N counts. An oscillator 93 supplies a fixed frequency signal 105 comprising a series of high repetition rate pulses to a terminal B such that a substantial number of cycles of this signal occur during the duration of the sync pulses 101 in the clock signal 100 at the terminal 42. The terminal B is connected as an input to a signal receiving terminal of the counter 92 which receives the fixed high frequency signal 105 and develops, when enabled, a count related to the number of cycles of the received high frequency signal. The counter 92 has an overflow terminal D which corresponds to the output terminal 46 of the digital detector 45.

The waveforms produced at the terminals A, B and D are illustrated in FIGS. 5A, 5B, 5D, respectively. FIG. 5C illustrates a waveform representative of the count of the number of cycles received from the terminal B by the counter 92 when the counter is enabled. In all of these Figures the horizontal axes represent time and are identical in scale, and the vertical axes represent amplitude.

Essentially the digital synchronous pulse detector 45 is intended to determine when a synchronizing pulse having at least a relatively long first duration is received at the clock terminal 42. While this could be accomplished by an integrating capacitor, as it is in the television art, that proper technique is extremely susceptible to amplitude variation spikes causing errors in the detection of synchronizing pulses. In the operation of the present transceiver, the misdetection of a synchronizing pulse could greatly adversely affect the operation of the transceiver, and thus capacitive techniques which depended upon integrating the amplitude of a received clock signal are not reliable enough for use in the transceiver.

In the present system, the oscillator 93 continuously supplies high frequency pulses as the input signal 105 to the counter 92. For each high frequency pulse in each cycle of signal 105, during the duration of each pulse of signal 100 (which pulses result in enabling the counter 92), the count of the counter 92 is incremented. The count of the counter 92 is reset and maintained at a zero count for every low amplitude of the clock signal 100 shown in FIG. 5A. Only during the high magnitudes of the signal 100 in FIG. 5A will the counter 92 be allowed to count cycles of the high frequency signal 105 of the oscillator 93. For the short duration (90 microseconds) positive pulses of the clock signal 100 after the sync pulse 101 the number of input cycles of the signal 105 received by the counter 92 will be less than the maximum capacity N of the counter. Thus no signal will be produced at the overflow terminal D.

However, when a relatively long duration pulse such as the synchronizing pulse 101 of the clock signal 100, which has a duration of 2 milliseconds, is received by the reset terminal 91, this results in allowing the counter 92 to continue to receive input cycles from the oscillator 93 such that the N capacity of the counter 92 is exceeded and an overflow indication at the terminal 46 is produced. FIG. 5C illustrates how this occurs by plotting the number of pulses of signal 105 received by the counter 92 on the same time scale as the resetting clock pulses of signal 100 received at the terminal 91. It is clear that at a subsequent time $t_S$, which occurs later than the initilizing time $t_0$ at which the sync pulse 101 occured, the count of the counter 92 will exceed its maximum capacity count N and result in producing a synchronizing pulse at the terminal D indicating that the synchronizing pulse detector 45 has detected the existence of a relatively long duration synchronizing pulse.

As was previously explained, the occurrence of the pulse at the terminal 46 results in initilizing multiplex circuits such that they can be properly synchronized with respect to the subsequent clock pulses so as to provide for the proper transmission of data between the receiver chassis 11 and microphone chassis 13A. The present implementation of the digital synchronizing pulse detector is substantially immune from amplitude variations which may be caused by extraneous noise pulses. In fact, the present detector is almost totally immune from providing a mistaken identification of a sync pulse due to noise pulse effects, and certainly is much more immune than any other synchronizing pulse detectors which depend upon integrating the amplitude of a received clock signal over the duration during which the signal was received.

It should be noted that the transceiver disclosed herein required several design modifications before it was considered a commercially satisfactorily operational device. One of these design modifications required physically rearranging the conductor paths on and providing various bypass components on a printed circuit board in the transceiver chassis. This printed circuit board provided conductors for the multiplexed data and clock signal 100, and also provided conductors for the signal path for the transceiver received CB signals between the antenna and speaker. It was found that the physical location of conductors on the printed circuit board and the transceiver circuit design had to be modified to provide sufficient electrical isolation between the multiplexed data and clock signal conductors and the transceiver received radiation (active channel) CB signal path. This was necessary since it was found that the multiplexing of information between the transceiver chassis 11 and microphone affected the receiver sensitivity since the multiplexing signals evidently sprayed (radiated) into adjacent conductors carrying the received CB signals. In addition, another design change was required since the original design contemplated directly using, via an additional cable conductor, the unmultiplixed microphone push-to-talk switch 27 to control turning on the speaker 29, but using the multiplexed sensing of the actuation of the switch 27 to turn off the transceiver transmit circuitry. This created a delay which resulted in annoying noise pops occurring on the speaker when the transmit circuitry was shut off after the speaker was turned on. This was cured by utilizing the signal on line 31 to simultaneously control both functions. Both design modifications were necessary before the receiver portion of the transceiver 10 was considered commercially satisfactory.

While there have been shown and described specific embodiments of this invention, further modifications and improvements will occur to those skilled in the art. All such modifications which retain the basic underlying principles disclosed and claimed herein are within the scope of this invention.

We claim:

1. A receiver including a synchronization system in which the operation of local and remote switching circuits are synchronized by a received clock signal, said receiver and synchronization system including:
   receiver means located in a main receiver chassis for receiving information transmitted on at least a predetermined channel and providing corresponding indicative signals in response thereto;
   local and remote receiver switching circuits, said local switching circuit located in said main receiver chassis and said remote switching circuit located on a receiver remote control unit effectively electrically coupled to said main chassis, each of said switching circuits commencing a predetermined sequence of switching operations in accordance with the occurrence of received short duration clock pulses contained in a received clock signal once a periodic relatively long duration synchronization pulse, having a first duration, in the clock signal is detected as occurring, said short duration pulses having lesser durations than said first duration;
   at least one of said local and remote switching circuits including a digital synchronization pulse detector for detecting said periodic synchronization pulses contained in said clock signal, said digital synchronization pulse detector comprising;
   terminal means for receiving said clock signal which has said periodic synchronization pulses of said first duration and said short duration pulses;
   oscillator means for producing a fixed frequency signal having a predetermined periodic repetition rate insuring the occurrence of a substantial number of cycles of said fixed frequency signal during said first duration of the synchronization pulses of the clock signal;
   counter means for receiving, during said clock signal pulses, said fixed frequency signal and developing a count related to the number of cycles of said fixed frequency signal received, said counter means having a maximum capacity of N counts and including an overflow terminal means at which an indicative signal is produced when the N count capacity of said counter means is exceeded, said counter means also having a reset terminal means for reinitializing the count of said counter means in response to received pulses, said terminal means coupled to said reset terminal means wherein for said synchronization pulses of said first duration the count in said counter means will exceed N counts resulting in indicating the detection of a synchronization pulse by providing an indicative signal at said overflow terminal means, and wherein said lesser duration pulses result in resetting the count of said counter means before said counter means can attain a count of N counts, said indicative signal at said overflow terminal means coupled to one of said local and remote switching circuits to insure proper synchronous operation of said local and remote switching circuits.

2. A receiver including a synchronization system in which the operation of local and remote switching circuits are synchronized by a received clock signal, said receiver and synchronization system including;
   receiver means located in a main receiver chassis for receiving information transmitted on at least a predetermined channel and providing corresponding indicative signals in response thereto;

local and remote receiver switching circuits, said local switching circuit located in said main receiver chassis on said remote switching circuit located on a receiver remote control unit coupled to said main chassis by a multiwire cable, each of said switching circuits commencing a predetermined sequence of switching operations in accordance with the occurrence of received short duration clock pulses contained in a received clock signal once a periodic relatively long duration synchronization pulse, having a first duration, in the clock signal is detected as occurring, said short duration pulses having lesser durations than said first duration;

at least one of said local and remote switching circuits including a digital synchronization pulse detector for detecting said periodic synchronization pulses contained in said clock signal, said digital synchronization pulse detector comprising;

terminal means for receiving said clock signal which has said periodic synchronization pulses of said first duration and said short duration pulses;

oscillator means for producing a fixed frequency signal having a predetermined periodic repetition rate insuring the occurrence of a substantial number of cycles of said fixed frequency signal during said first duration of the synchronization pulses of the clock signal;

counter means for receiving, during said clock signal pulses, said fixed frequency signal and developing a count related to the number of cycles of said fixed frequency signal received, said counter means having a maximum capacity of N counts and including an overflow terminal means at which an indicative signal is produced when the N count capacity of said counter means is exceeded, said counter means also having a reset terminal means for reinitializing the count of said counter means in response to received pulses, said terminal means coupled to said reset terminal means wherein for said synchronization pulses of said first duration the count in said counter means will exceed N counts resulting in indicating the detecting of a synchronization pulse by providing an indicative signal at said overflow terminal means, and wherein said lesser duration pulses result in resetting the count of said counter means before said counter means can attain a count of N counts, said indicative signal at said overflow terminal means coupled to one of said local and remote switching circuits to insure proper synchronous operation of said local and remote switching circuits.

3. A receiver including a time shared multiplexing system in which local and remote receiver circuits receive/transmit series data signals over a single common data line, the operation of said local and remote circuits each being synchronized by a received clock signal, said receiver and multiplex system comprising;

receiver means located in a main receiver chassis for receiving information transmitted on at least a predetermined channel and providing corresponding indicative signals in response thereto;

local and remote receiver switching circuits, said local switching circuit located in said main receiver chassis and said remote switching circuit located on a receiver remote control unit coupled to said main chassis by a multiwire cable, each of said switching circuits commencing a predetermined sequence of switching operations resulting in the sequential transmission of data between said receiver chassis and said remote control unit over a data conductor in said cable in accordance with the occurrence of received short duration clock pulses contained in a received clock signal once a periodic relatively long duration synchronization pulse, having a first duration, in the clock signal is detected as occurring, said short duration pulses having lesser durations than said first duration;

at least one of said local and remote switching circuits including a digital synchronization pulse detector for detecting said periodic synchronization pulses contained in said clock signal, said digital synchronization pulse detector comprising;

terminal means for receiving said clock signal which has said periodic synchronization pulses of said first duration and said short duration pulses;

oscillator means for producing a fixed frequency signal having a predetermined periodic repetition rate insuring the occurrence of a substantial number of cycles of said fixed frequency signal during said first duration of the synchronization pulses of said clock signal;

counter means for receiving, during said clock signal pulses, said fixed frequency signal and developing a count related to the number of cycles of said fixed frequency signal received, said counter means having a maximum capacity of N counts and including an overflow terminal means at which an indicative signal is produced when the N count capacity of said counter means is exceeded, said counter means also having a reset terminal means for reinitializing the count of said counter means in response to received pulses, said terminal means coupled to said reset terminal means wherein for said synchronization pulses of said first duration the count in said counter means will exceed N counts resulting in indicating the detection of a synchronization pulse by providing an indicative signal at said overflow terminal means, and wherein said lesser duration pulses result in resetting the count of said counter means before said counter means can attain a count of N counts, said indicative signal at said overflow terminal means coupled to one of said local and remote switching circuits to insure proper synchronous operation of said local and remote switching circuits.

4. A receiver time shared multiplex system according to claim 3 wherein said remote control unit comprises a microphone.

5. A receiver time shared multiplex system according to claims 3 or 4 wherein said clock signal is coupled between said main receiver chassis and said remote control unit by a conductor in said cable other than said data conductor.

* * * * *